(12) United States Patent
Tazartes et al.

(10) Patent No.: US 6,424,419 B1
(45) Date of Patent: Jul. 23, 2002

(54) SYSTEM AND METHOD FOR PROVIDING CAVITY LENGTH CONTROL OF A RING LASER GYROSCOPE

(75) Inventors: Daniel Tazartes, West Hills; John Mark, Pasadena; Albert V. Scappaticci, Calabasas; Michael W. Denice, Jr., Westlake Village, all of CA (US)

(73) Assignee: Northrop Grumman Corporation, Woodland Hills, CA (US)

( * ) Notice: Subject to any disclaimer, the term of this patent is extended or adjusted under 35 U.S.C. 154(b) by 55 days.

(21) Appl. No.: 09/628,071

(22) Filed: Jul. 28, 2000

(51) Int. Cl.$^7$ .................................................. G01C 19/66
(52) U.S. Cl. .......................................... 356/473; 372/99
(58) Field of Search .................... 356/472, 473, 356/474, 475; 372/28, 29.02, 29.022, 32, 94, 99, 107

(56) References Cited

U.S. PATENT DOCUMENTS 4,386,853 A   6/1983  Ljung
5,208,653 A   5/1993  Mark et al.
5,374,990 A * 12/1994 Hahn et al. ................. 356/467
5,448,354 A   9/1995  Schmars et al.

* cited by examiner

Primary Examiner—Samuel A. Turner
(74) Attorney, Agent, or Firm—Price and Gess

(57) ABSTRACT

A system and method for controlling the cavity length of a ring laser gyroscope to properly tune the resonant wavelengths of the ring laser gyroscope during moments when experiencing sudden shocks or high g force accelerations. The system controls the position of a movable mirror in the laser cavity of the gyroscope to control the length of the laser cavity. The system measures the acceleration experienced by the laser cavity, wherein the position of the movable mirror is adjusted to counteract the effects of the acceleration on the movable mirror in a real-time response to the measured acceleration. By adjusting the position of the movable mirror, the resonant wavelengths propagating in the ring laser gyroscope will be maintained at their desired intensity and continue to lase even after experiencing this acceleration. The system may further include a control servo-loop for providing additional cavity length control in order to maintain the desired intensity of the wavelengths propagating within the gyroscope.

20 Claims, 6 Drawing Sheets

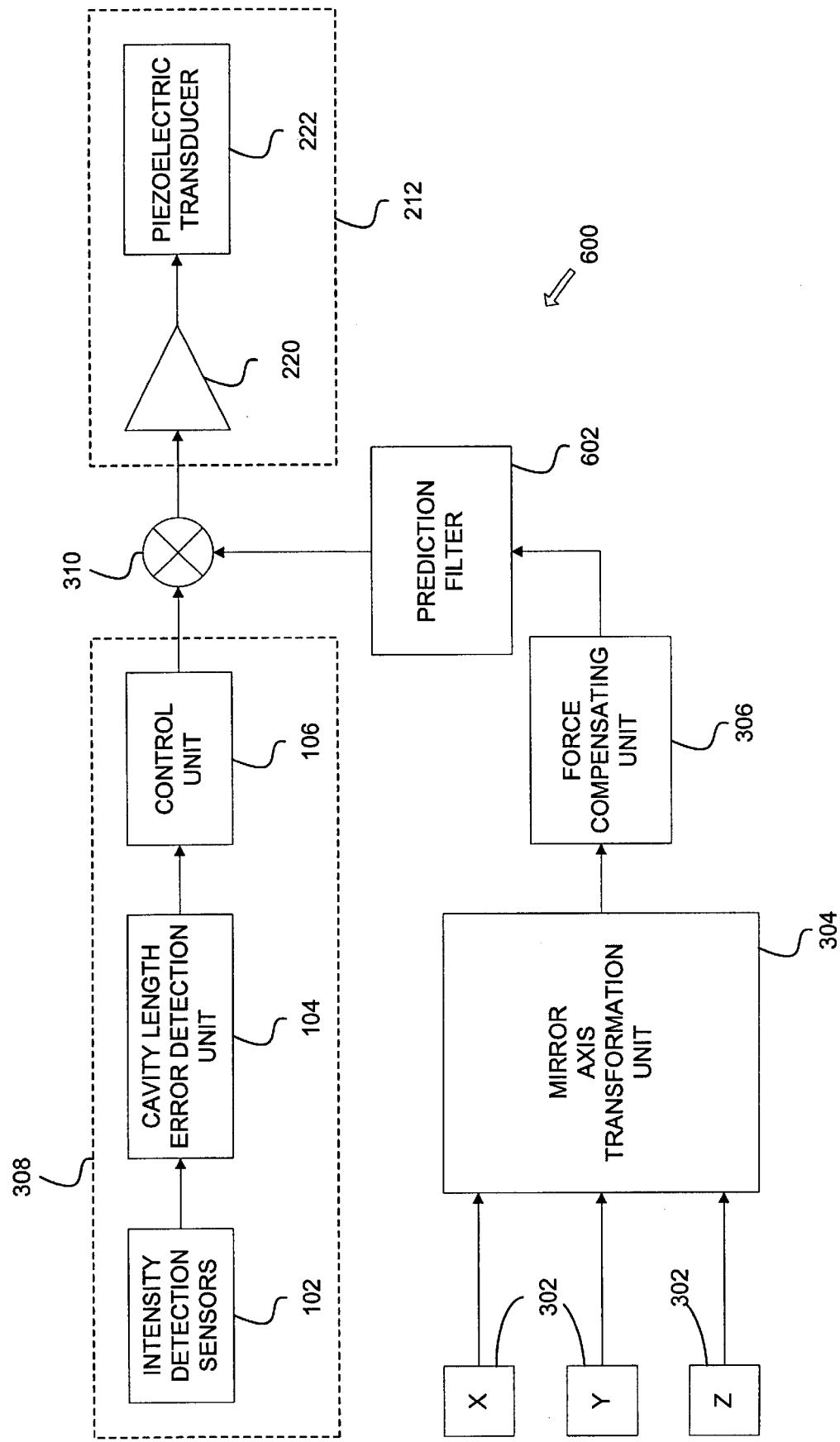

SYSTEM AND METHOD FOR PROVIDING CAVITY LENGTH CONTROL OF A RING LASER GYROSCOPE

BACKGROUND OF THE INVENTION

1. Field of the Invention

The present invention relates generally to a ring laser gyroscope, and specifically to a system and method for providing cavity length control in a ring laser gyroscope in response to sudden shocks and high g-force loads experienced by the ring laser gyroscope.

2. Description of Related Art

A ring laser gyroscope is a wave resonator which sustains multiple laser modes within a ring cavity. A laser light beam is introduced into the e ring cavity at a frequency such than an integral number of wavelengths will fit exactly within the path length of the resonant ring cavity. An integral number of wavelengths around the light beam cavity path of the gyroscope are required to support resonant operation. The ring cavity is filled with an active gaseous medium, typically Helium and Neon, to provide the gain for the laser beam and for sustaining a plurality of laser modes propagating within the ring cavity.

The ring laser gyroscope includes at least one pair of counterpropagating light beams traveling around the resonator path in the ring cavity. A plurality of mirrors form the ring resonator path, where one of the mirrors is slightly transmissive to allow light to leave the resonator. The light passing through the transmissive mirror is appropriately recombined and the intensity of an interference pattern is sensed and processed to compute angular displacement, angular velocity, fringe rate, etc., about a predetermined axis. In order to ensure proper lasing operation, the cavity length must be tuned in such a way that the gaseous medium will provide sufficient gain at the cavity's resonant frequency.

One manner of controlling cavity length has been accomplished by adjusting the position of at least one of the corner mirrors in the resonant cavity to control the cavity length of the ring laser gyroscope, as taught by U.S. Pat. No. 5,208,653 (issued May 4, 1993) entitled "MULTIOSCILLATOR RING LASER GYROSCOPE ADAPTIVE DIGITALLY CONTROLLED CAVITY LENGTH CONTROL SYSTEM," which was filed by two of the applicants hereto and assigned to the common assignee of this application. In this type of cavity length control system, a piezoelectric transducer having driving electrodes is attached to a movable mirror to change the position of the movable mirror depending upon the voltage delivered to the electrodes. A control servo-loop is used to monitor the operation of the ring laser gyroscope and adjust the position of the movable mirror to maintain the cavity resonance at a desirable gain condition, where a typical servo-loop is illustrated in FIG. 1. The intensity of the laser light passing through the partially transparent mirror is observed by intensity detection sensors 102. A cavity length error detection unit 104 then determines whether the measured intensity deviates from the desired maximum intensity, where a control unit 106 then applies a control algorithm to determine the amount of movement required to adjust the cavity length to achieve the desired intensity condition of the propagating wavelengths. The control unit 106 then instructs a mirror driver amplifier 108 to apply a certain voltage to the piezoelectric transducer 110 in order to provide the appropriate cavity length correction. The piezoelectric transducer 110 then applies a force on the movable mirror in order to appropriately change its position and, in turn, the cavity length.

One significant problem which arises in this type of ring laser gyroscope is that when experiencing sudden shocks or high g force accelerations, the movable mirror and piezoelectric transducer assembly also move relative to the cavity body due to their inertia and the finite stiffness of the assembly. For slowly varying disturbances, the control servo-loop driving the piezoelectric transducer will compensate for the cavity length change by measuring the light passing through a partially transparent mirror and adjusting the voltage applied to the piezoelectric transducer to maintain the propagating wavelengths at the desired intensity condition. Unfortunately, the bandwidth of the control loop is often limited as a result of the cavity length error determination method and the digital signal processing iteration rate utilized. Further, the light intensity measurement itself can be noisy, and this noise would thus be demodulated and applied to the mirror via feedback in the control loop. It is undesirable to have this type of high frequency noise on the mirror, because this would produce noise in the gyroscope output as well.

In order to avoid this problem with noise without increasing the bandwidth through expensive and complicated measures, the control servo-loop typically has a very narrow bandwidth. Due to this narrow bandwidth, it is no possible for the control servo-loop to respond to rapid variations in cavity length which may result from suddenly encountered shocks. As a result, the instantaneous cavity length can change substantially during large shocks or sudden high g force accelerations. If the change in cavity length is large enough, some of the laser modes will have insufficient gain to be resonant which can cause them to drop out. This detrimentally affects the operation of the gyroscope by producing erroneous measurements. Other attempts at resisting high g forces in a ring cavity gyroscope have been directed at making the mirror stiffer to resist movement. However, a stiffer mirror also requires a larger amount of force to be applied by the piezoelectric transducer to move the mirror, wherein conventional piezoelectric transducers are limited in the amount of force which they can generate. Thus, merely stiffening the mirror has not proven to be effective in providing proper cavity length control in high g force environments.

There is clearly a need for a system and method for controlling the cavity length of a ring laser gyroscope in response to sudden shocks or high g forces. Moreover, there is a need for a cavity length control system and method which maintains the cavity resonance of a ring laser gyroscope at a desirable gain condition at all times in a high g-force environment.

SUMMARY OF THE INVENTION

The present invention provides a system and method for controlling the cavity length of a ring laser gyroscope to properly tune the resonant wavelengths of the ring laser gyroscope relative to the gain curve during moments when experiencing sudden shocks or high g force accelerations. The system includes a ring laser gyroscope having an optical pathway for light waves propagating among a plurality of mirrors defining the optical pathway, wherein at least one of the mirrors is movable for changing the length of the optical pathway. A mirror driver is provided for moving the movable mirror for purposes of cavity length control. The cavity length control system provides controlled activation of the mirror driver. The system includes at least one accelerometer for measuring the acceleration experienced by the ring laser gyroscope, wherein a compensation signal for activating the mirror driver is generated that is relative to the measured acceleration to counteract the effects of the acceleration on the movable mirror. By adjusting the position of the movable mirror, the wavelengths propagating in the ring laser gyroscope will remain resonant and continue to lase even while experiencing this acceleration.

The cavity length control system may further include a prediction filter for estimating the acceleration which will be measured next by the accelerometer. Since the compensation signal is providing cavity length control for accelerations which have already been measured, the estimated acceleration measurement is used to modify the compensation signal in order to predict the appropriate cavity length correction required to maintain the wavelengths in the ring laser gyroscope resonant in a real-time manner. The system may further include a control servo-loop for monitoring the intensity of the wavelengths propagating within the gyroscope and controlling the position of the movable mirror by producing a servo-loop control signal that is a function of mirror control voltage and the change in light wave intensity as such intensity relates to the mirror driver voltage. The servo-loop control signal is combined with the compensation signal to generate a mirror driver signal which provides activation of the mirror driver for providing both immediate and long-term cavity length control.

BRIEF DESCRIPTION OF THE DRAWINGS

The features of the present invention, which are believed to be novel, are set forth with particularity in the appended claims. The present invention, both as to its organization and manner of operation, together with further advantages, may best be understood by reference to the following description, taken in connection with the accompanying drawings in which the reference numerals designate like parts throughout the figures thereof and wherein:

FIG. 6 is a block schematic diagram of another preferred embodiment of the ring laser gyroscope cavity length control system of the present invention.

DETAILED DESCRIPTION OF THE PREFERRED EMBODIMENTS

The following description is provided to enable any person skilled in the art to make and use the invention and sets forth the best modes contemplated by the inventors of carrying out their invention. Various modifications, however, will remain readily apparent to those skilled in the art, since the general principles of the present invention have been defined herein specifically to provide a system and method of controlling the cavity length of a ring laser gyroscope.

Figure 2:
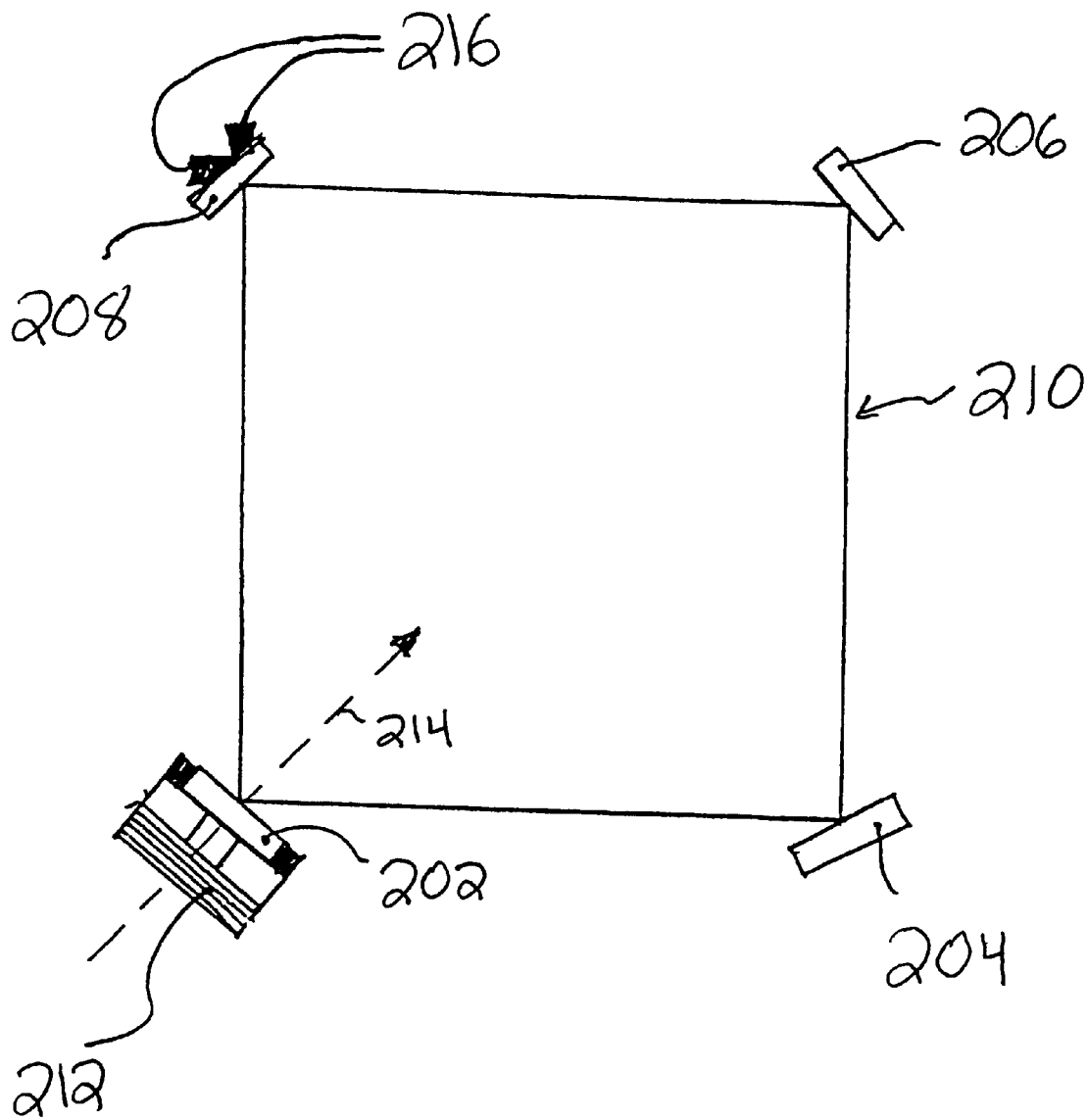
FIG. 2 is a schematic diagram showing the hardware configuration of a ring laser gyroscope used in the ring laser gyroscope cavity length control system of the present invention.

Referring now to FIG. 2, a ring laser gyroscope 200 may be configured using a set of four mirrors 202, 204, 206, and 208 to form a beam path 210 for wavelengths of light to propagate, while it is understood to those skilled in the art that any number of a plurality of mirrors may be utilized. The mirrors form a ring cavity, wherein the position of the mirrors and the frequency of the laser light introduced into the ring cavity are selected such that an integer number of wavelengths will fit exactly within the cavity length of the beam path 210. At least one of the mirrors, such as mirror 202, is movable to enable the cavity length of the beam path 210 to be adjusted. The movable mirror 202 is attached to a mirror driver 212, preferably comprising a mirror driver amplifier and a piezoelectric transducer, which controls the position of the movable mirror 202. The mirror driver 212 moves the movable mirror 202 either inwardly or outwardly along a central axis 214 of the mirror driver 212 which, in turn, alters the cavity length of the beam path 210.

Figure 1:
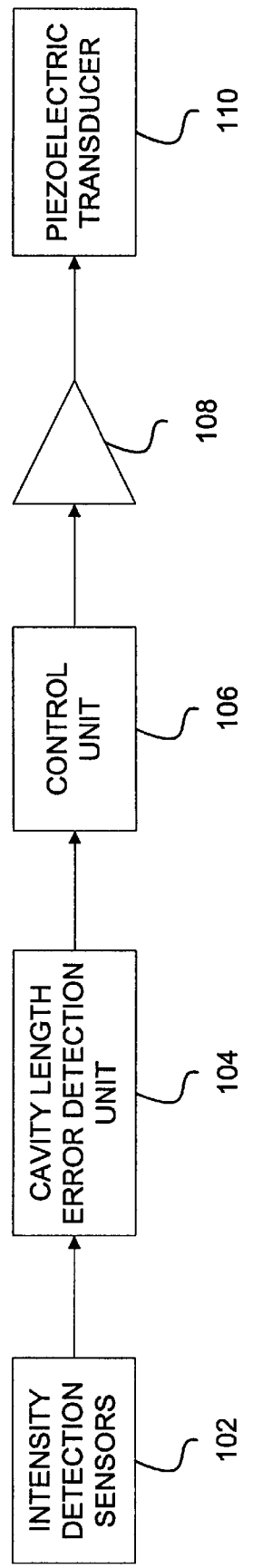
FIG. 1 is a block schematic diagram of a conventional ring laser gyroscope cavity length control servo-loop.

Another of the mirrors, such as mirror 208, may be partially transmissive to allow the propagating light beams to pass through to a sensor 216, such as a photodiode, for measuring the intensity of the propagating wavelengths of light. A control servo-loop, as described in connection with FIG. 1, is used to maximize the intensity of the propagating wavelengths by monitoring the intensity of the wavelengths measured by the sensor 216, determining the amount of error in the cavity length and the correction required to maximize wavelength intensity, and determining the voltage to be applied to the mirror driver 212 to adjust the position of the movable mirror 202 to the desired cavity length for maximum wavelength intensity.

When experiencing a high g-force load due to a large shock or acceleration, it has been found that the finite stiffness and inertia of the movable mirror 202 and the mirror driver 212 attached thereto will cause these components to move relative to the remaining components in the ring laser gyroscope 200. Even the slightest movement of the movable mirror 202 will cause an instantaneous change in cavity length, which can result in a loss in resonancy of some of the laser modes propagating in the ring laser gyroscope 200. As previously described, a control servo-loop is effective in maintaining the desired intensity condition of the propagating wavelengths for slowly varying disturbances, but the limited bandwidth of the control servo-loop renders it ineffective in accounting for instantaneous changes in cavity length. The present invention is directed toward preventing a loss in resonancy of the wavelengths propagating within the ring laser gyroscope 200 by adjusting the cavity length in a real-time response to sudden high g-loading experienced by the ring laser gyroscope 200.

Figure 3:
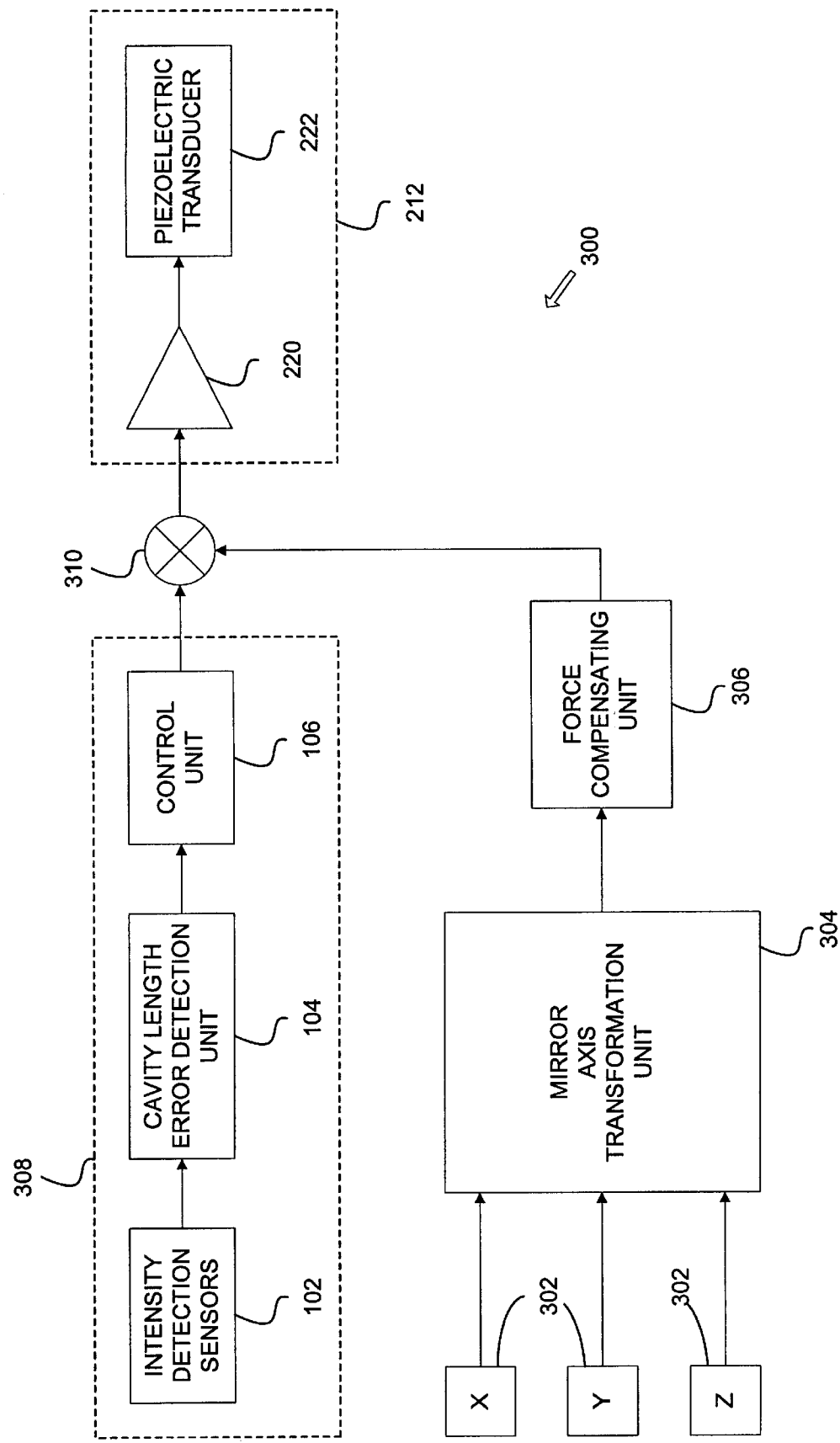
FIG. 3 is a block schematic diagram of a preferred embodiment of the ring laser gyroscope cavity length control system of the present invention.

Referring now to FIG. 3, a block schematic diagram of a preferred embodiment of a ring laser gyroscope cavity length control system 300 of the present invention is illustrated. While the system 300 will be described as controlling the cavity length of a ring laser gyroscope, it is understood that the system 300 of the present invention can be utilized to control the length of any type of similar laser cavity. The system 300 includes at least one accelerometer 302 for measuring the acceleration experienced by the ring laser gyroscope 200 in a predetermined direction. Three accelerometers 302 are preferably provided for measuring acceleration in three orthogonal directions (along the X, Y, and Z coordinate axes). The measured accelerations are fed into a mirror axis transformation unit 304 for converting the accelerations measured in their respective directions into a mirror axis acceleration along the direction of mirror g-sensitivity, such as the mirror driver axis 214. In order to compensate for the forces associated with mirror axis acceleration which will be acting on the movable mirror 202, the mirror axis acceleration is fed into a force compensating unit 306 which determines an amount to adjust the movable mirror 202 in order to cancel the force induced on the movable mirror 202 by the high g-loading.

The force compensating unit 306 generates a compensation signal which activates the mirror driver 212 relative to the measured acceleration. The compensation signal is generated by converting the measured mirror axis acceleration into an appropriate amount of mirror driver activation using a conversion based on the compliance and forcing function of the mirror driver 212, where a predetermined scale factor may be applied to the mirror axis acceleration to produce the compensation signal. The compensation signal is applied as a voltage input to the mirror driver 212 such that a force will be generated on the movable mirror 202 to counteract the force induced by the sudden shock or g-loading. The mirror driver 212 preferably includes an amplifier 220 which receives the compensation signal and provides an electrical drive for a piezoelectric transducer 222 connected to the movable mirror 202. By adjusting the position of the movable mirror 202 to counteract the measured acceleration, the wavelengths propagating in the ring laser gyroscope 200 will remain resonant during high g-force accelerations or shocks.

Figure 4:
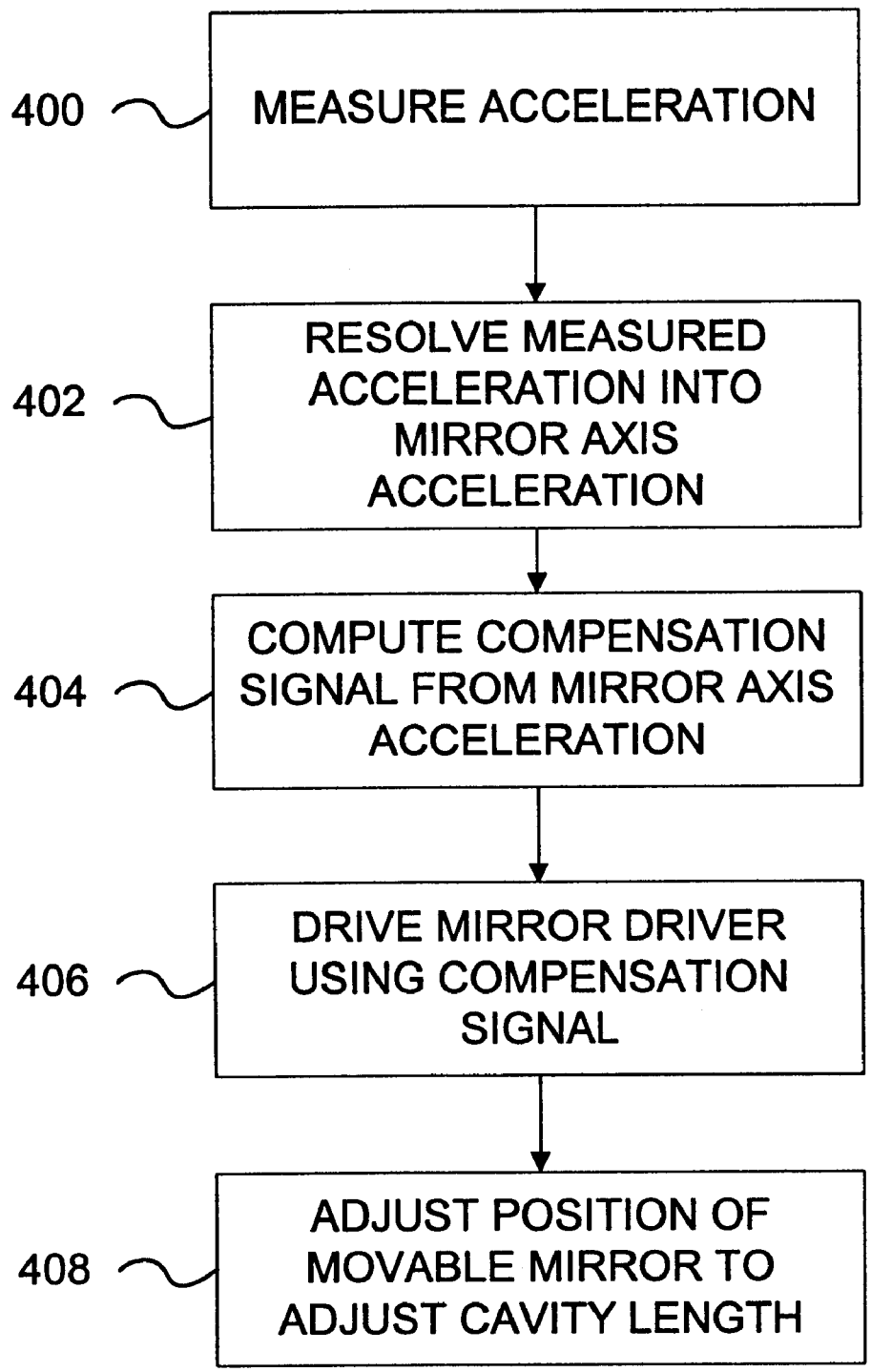
FIG. 4 is an operational block diagram of a preferred method of the present invention for controlling the cavity length of a ring laser gyroscope.

Referring now to FIG. 4, a preferred method of the present invention for controlling the cavity length of a ring laser gyroscope will be described with reference to an operational block diagram. Initially, in step 400 the acceleration experienced by the ring laser gyroscope 200 is measured. The measured acceleration is then resolved into the mirror axis acceleration along the direction of the mirror driver axis in step 402, wherein this step will typically involve an orthogonal transformation from three acceleration measurements in respective orthogonal directions into the mirror axis acceleration. A scale factor is applied to the mirror axis acceleration in step 404 to convert the mirror axis acceleration into a compensation signal providing the appropriate electrical drive to activate the mirror driver 212. The compensation signal drives the mirror driver 212 in step 406 to move the piezoelectric transducer 222 the desired amount. Finally in step 408, the mirror driver 212 adjusts the position of the movable mirror 202 to change the cavity length in a determined amount to counteract the effect of the measured acceleration.

Referring back to FIG. 3, the cavity length control system 300 may further include a servo-loop control portion 308 for providing additional cavity length control to sustain the wavelengths propagating within the ring laser gyroscope 200 at their maximum intensity. The servo-loop control portion 308 measures the intensity of the wavelengths propagating within the gyroscope and produces a servo-loop control signal that is a function of mirror control voltage and the change in light wave intensity as such intensity relates to the mirror driver voltage. The servo-loop control signal is used to drive the mirror driver 212 to adjust the cavity length to maintain the desired intensity. The servo-loop control signal by itself fails to sufficiently account for sudden shocks and high g accelerations, so the servo-loop control signal is used to supplement the cavity length control provided by the compensation signal to provide the desired mirror driver activation. The servo-loop control signal is combined with the compensation signal in adder 310 to produce a mirror driver signal that drives the mirror driver 212. Thus, the servo-loop control signal provides long-term cavity length control while the compensation signal is used to provide immediate, real-time cavity control to account for sudden changes in cavity length due to measured accelerations.

Figure 5:
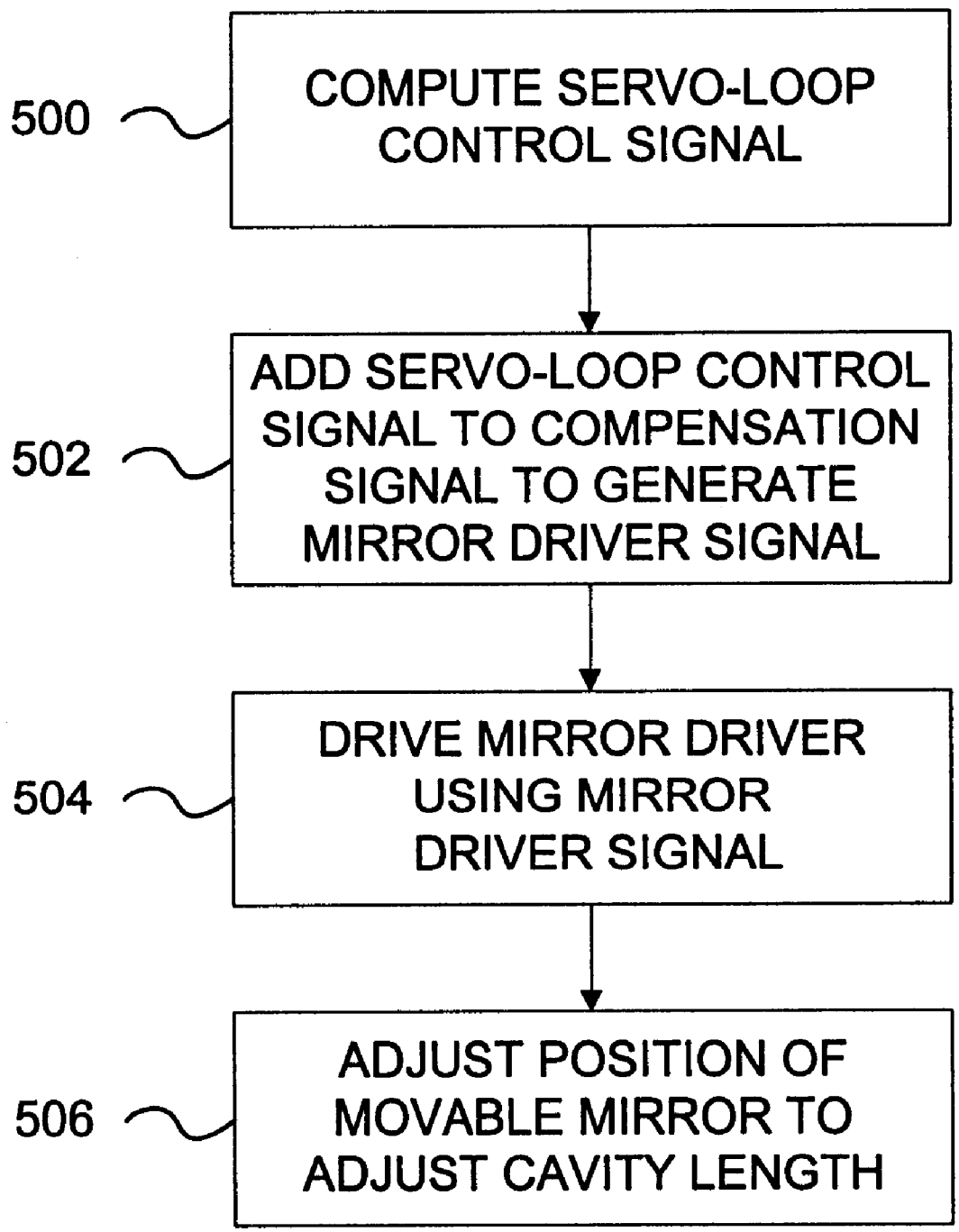
FIG. 5 is an operational block diagram of another preferred method of the present invention for providing both immediate and long-term cavity length control of a ring laser gyroscope.

Referring now to FIG. 5, an operational block diagram of another preferred embodiment of the present invention is illustrated for providing both immediate and long-term cavity length control of a ring laser gyroscope 200. In step 500, the servo-loop control signal is generated as described above by measuring the intensity of the wavelengths propagating in the ring laser gyroscope and determining the appropriate amount of required cavity length correction to maximum the beam intensity. The servo-loop control signal is then combined with the compensation signal in step 502 to produce a mirror driver signal which contains both long-term and immediate, real-time components of cavity length control for the mirror driver. The mirror driver 212 is then driven by the mirror driver signal in step 504 to activate the piezoelectric transducer 222 accordingly, and the mirror driver 212 then adjusts the position of the movable mirror 202 in step 506.

In another preferred embodiment of the present invention, the cavity length control system 600 may further include a prediction filter 602 for estimating the acceleration to be measured next by the accelerometer, as illustrated in FIG. 6. The remaining components of FIG. 6 function identically to their respective similarly numbered components from FIG. 3. Since the generated compensation signal is compensating for accelerations which have already been measured, the amount of compensation may differ from the amount required to accurately account for the current acceleration being experienced by the cavity length control system 600. Thus, an estimated acceleration measurement is used to anticipate the next measured acceleration in order to more accurately predict the acceleration being experienced by the ring laser gyroscope 200 at the time the movable mirror 202 is being adjusted. The prediction filter 602 modifies the compensation signal in order to predict the correction required to maintain the wavelengths in the ring laser gyroscope resonant in a real-time manner, wherein the prediction filter 602 may comprise any type of filter known to those skilled in the art for estimating future measurements in response to past measurements.

As can be seen from the foregoing, the ring laser gyroscope cavity length control system of the present invention prevents a loss of gyroscope resonant characteristics and maintains full operability of the ring laser gyroscope during sudden shocks or high g-loading. In response to short shock impulses, the ring laser gyroscope cavity length control system of the present invention adjusts the cavity length to ensure that all modes of the gyroscope continue to lase. For sustained acceleration, the ring laser gyroscope cavity length control system will initially maintain the proper cavity length to ensure lasing and the control servo-loop will supplement this control to fine tune the cavity length to its desired value for maintaining maximum intensity of the wavelengths propagating in the gyroscope. In this manner, the ring laser gyroscope cavity length control system of the present invention provides more accurate and reliable gyroscope measurements, even when experiencing forces induced by high g-loads.

In each of the above embodiments, the different structures of the system for controlling the cavity length of a ring laser gyroscope of the present invention are described separately in each of the embodiments. However, it is the full intention of the inventors of the present invention that the separate aspects of each embodiment described herein may be combined with the other embodiments described herein. Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

What is claimed is:

1. A laser cavity length control system, comprising:
    a laser cavity having an optical pathway for light waves propagating among a plurality of mirrors defining said optical pathway, wherein at least one of the mirrors is movable to change the length of said optical pathway;
    at least one accelerometer for measuring the acceleration of the laser cavity; and
    a force compensating unit which controls the position of said at least one movable mirror based on the measured acceleration to control cavity length.

2. The laser cavity length control system of claim 1, further comprising a mirror driver for changing the position of said at least one movable mirror.

3. The laser cavity length control system of claim 2, wherein said force compensating unit determines an amount of movement of said at least one movable mirror and outputs a compensation signal instructing said mirror driver to adjust the position of said at least one movable mirror based on the determined amount of movement.

4. The laser cavity length control system of claim 3, further comprising a mirror axis transformation unit for the converting the acceleration measured in a predetermined direction into a mirror axis acceleration in a direction along an axis of said mirror driver, wherein said mirror driver moves said at least one movable mirror inwardly or outwardly along the mirror driver axis.

5. The laser cavity length control system of claim 4, wherein three accelerometers are provided for respectively measuring acceleration in three orthogonal directions, wherein the mirror axis transformation unit orthogonally transforms the measured accelerations into a single mirror axis acceleration.

6. The laser cavity length control system of claim 4, wherein the force compensating unit generates said compensation signal by multiplying the mirror axis acceleration by a scale factor.

7. The laser cavity length control system of claim 4, further comprising a prediction filter for estimating a current mirror axis acceleration currently being experienced by the laser cavity and adjusting the compensation signal sent to the mirror driver based upon the estimated current mirror axis acceleration.

8. The laser cavity length control system of claim 2, wherein the mirror driver includes an amplifier and a transducer connected to said at least one movable mirror which to adjusts the position of said at least one movable mirror.

9. The laser cavity length control system of claim 8, wherein said transducer is a piezoelectric transducer.

10. The laser cavity length control system of claim 3, further comprising:
    a sensor for detecting intensity of the light waves propagating within said laser cavity; and
    a servo-loop for controlling the movement of said at least one movable mirror which produces a servo-loop control signal that is a function of mirror control voltage and the change in light wave intensity as such intensity relates to said mirror control voltage;
    wherein said servo-loop control signal is modified by said compensation signal to produce a mirror driver signal which is transmitted to said mirror driver.

11. The laser cavity length control system of claim 1, wherein said laser cavity is arranged in a ring configuration to form a ring laser gyroscope.

12. A method of controlling the length of a laser cavity having an optical pathway for light waves propagating among a plurality of mirrors defining said optical pathway, where one of said mirrors is movable to change the length of said optical pathway, comprising the steps of:
    measuring the acceleration of said laser cavity in at least one direction; and
    adjusting said movable mirror to change the length of said optical pathway of the propagating light waves based on the measured acceleration.

13. The method of claim 12, further comprising the step of converting the measured acceleration into a compensation signal indicative of the amount to move said movable mirror to counteract the acceleration experienced by the ring laser gyroscope.

14. The method of claim 13, further comprising the step of converting the acceleration measured in said at least one direction into a mirror axis acceleration in a direction along an axis of a mirror driver used to adjust said movable mirror, wherein said mirror driver moves said movable mirror inwardly or outwardly along the mirror driver axis to change the length of said optical pathway.

15. The method of claim 14, wherein acceleration is measured in three orthogonal directions and converted into a single mirror axis acceleration.

16. The method of claim 14, wherein said compensation signal is generated by multiplying said mirror axis acceleration by a scale factor.

17. The method of claim 13, further comprising the steps of:
    estimating a current mirror axis acceleration currently being experienced by the laser cavity; and
    adjusting the compensation signal used to adjust the movable mirror position based upon the estimated current mirror axis acceleration.

18. The method of claim 12, wherein the position of the movable mirror is adjusted by a mirror driver including an amplifier and a transducer connected to said movable mirror.

19. The method of claim 14, further comprising the steps of:
    detecting the intensity of the light waves propagating within said laser cavity;
    producing a control signal using a servo loop in order to control the movement of said movable mirror, wherein said servo-loop control signal is a function of mirror control voltage and the change in light wave intensity as such intensity relates to said mirror control voltage; and
    modifying said servo-loop control signal by said compensation signal to produce a mirror driver signal which is transmitted to said mirror driver to adjust the position of said movable mirror.

20. The method of claim 12, wherein said laser cavity is arranged in a ring configuration to form a ring laser gyroscope.

* * * * *